(12) United States Patent
Takemura et al.

(10) Patent No.: US 10,544,993 B2
(45) Date of Patent: Jan. 28, 2020

(54) COOLING DEVICE WITH A PLURALITY OF PIPE UNITS CONNECTED TO A COMMON BASE

(71) Applicant: MITSUBISHI ALUMINUM CO., LTD., Minato-ku, Tokyo (JP)

(72) Inventors: Hiroshi Takemura, Shizuoka (JP); Yasuhito Sueki, Shizuoka (JP); Shun-ichi Sata, Shizuoka (JP); Tokio Hisano, Shizuoka (JP)

(73) Assignee: MITSUBISHI ALUMINUM CO., LTD., Shizuoka (JP)

( * ) Notice: Subject to any disclaimer, the term of this patent is extended or adjusted under 35 U.S.C. 154(b) by 0 days.

(21) Appl. No.: 15/537,288

(22) PCT Filed: Dec. 25, 2015

(86) PCT No.: PCT/JP2015/086286
§ 371 (c)(1),
(2) Date: Jun. 16, 2017

(87) PCT Pub. No.: WO2016/104727
PCT Pub. Date: Jun. 30, 2016

(65) Prior Publication Data
US 2018/0051936 A1 Feb. 22, 2018

(30) Foreign Application Priority Data
Dec. 25, 2014 (JP) .................................. 2014-262356

(51) Int. Cl.
*F28D 15/02* (2006.01)
*H01L 23/427* (2006.01)
(Continued)

(52) U.S. Cl.
CPC ................ *F28D 15/02* (2013.01); *F28F 1/24* (2013.01); *F28F 7/02* (2013.01); *H01L 23/3672* (2013.01);
(Continued)

(58) Field of Classification Search
CPC ................ F28D 15/02; F28D 15/0275; F28D 2015/0216; F28F 1/24; F28F 7/02
See application file for complete search history.

(56) References Cited

U.S. PATENT DOCUMENTS 5,253,702 A * 10/1993 Davidson ............ F28D 15/0233
165/104.14
5,651,414 A * 7/1997 Suzuki ................ F28D 15/0275
165/104.14
(Continued)

FOREIGN PATENT DOCUMENTS

JP    H09-042870 A    2/1997
JP    H10-274487 A   10/1998
(Continued)

OTHER PUBLICATIONS

International Search Report issued for PCT/JP2015/086286, dated Mar. 15, 2016.
(Continued)

*Primary Examiner* — Travis C Ruby
(74) *Attorney, Agent, or Firm* — Arent Fox LLP

(57) ABSTRACT

A cooling device including: a base block having a first length and a first thickness and having a mounting side on which a heat-generating body is installed along a first vertical direction. The cooling device further includes a pipe unit, including a tank buried at an opposite side to the mounting side of the base block for storing a coolant, and pipes which are connected to the tank and are parallel to one another. Heat radiation fins are disposed on the pipes in a state in which the
(Continued)

pipes penetrate the heat radiation fins. The cooling device in which the tank is formed has a flattened shape and a smaller dimension along a first thickness direction of the base block than a height dimension along the first length of the block. Each of the pipes are connected to an upper position of the tank with respect to the height dimension.

7 Claims, 3 Drawing Sheets

(51) Int. Cl.
  *F28F 1/24* (2006.01)
  *F28F 7/02* (2006.01)
  *H01L 23/367* (2006.01)
(52) U.S. Cl.
  CPC ........ *H01L 23/3677* (2013.01); *H01L 23/427* (2013.01)

(56) References Cited

U.S. PATENT DOCUMENTS

| | | | | |
|---|---|---|---|---|
| 5,925,929 | A * | 7/1999 | Kuwahara | H01L 23/427 165/80.4 |
| 7,926,553 | B2 * | 4/2011 | Dautert | F28D 15/0266 165/104.14 |
| 2004/0069461 | A1 | 4/2004 | Yuyama et al. | |
| 2007/0187069 | A1 * | 8/2007 | Ueno | F28D 15/0275 165/80.3 |
| 2011/0005727 | A1 * | 1/2011 | Yu | F28D 15/0233 165/104.26 |
| 2012/0002373 | A1 * | 1/2012 | Kitajima | F28D 15/0275 361/717 |
| 2012/0216991 | A1 * | 8/2012 | Chen | B23P 11/005 165/104.21 |
| 2013/0155616 | A1 * | 6/2013 | Tong | H01L 23/427 361/696 |
| 2013/0180688 | A1 * | 7/2013 | Lin | B22D 17/00 165/104.26 |
| 2014/0293541 | A1 * | 10/2014 | Opila | F28D 15/02 361/697 |
| 2015/0060020 | A1 * | 3/2015 | Yang | F28D 15/04 165/104.26 |

FOREIGN PATENT DOCUMENTS

| | | |
|---|---|---|
| JP | 2004-125381 A | 4/2004 |
| JP | 2009-270750 A | 11/2009 |
| JP | 2010-060164 A | 3/2010 |
| JP | 2010-133686 A | 6/2010 |
| JP | 2012-234928 A | 11/2012 |
| JP | 2014-159915 A | 9/2014 |

OTHER PUBLICATIONS

Extended European Search report of related European Patent Application No. 15873295.8 dated Sep. 17, 2018.
Japanese Office Action of related Japanese Patent Application No. 2016-566527 dated Dec. 11, 2018.

* cited by examiner

COOLING DEVICE WITH A PLURALITY OF PIPE UNITS CONNECTED TO A COMMON BASE

CROSS-REFERENCE TO RELATED APPLICATIONS

This present application is a National Stage entry of International Application No. PCT/JP2015/086286, filed Dec. 25, 2015, which claims priority to Japanese Patent Application No. 2014-262356, filed Dec. 25, 2014. The disclosures of the prior applications are incorporated in their entirety herein by reference.

BACKGROUND OF THE INVENTION

Technical Field

The present invention relates to a cooling device used for cooling: power conversion equipment for construction equipment (hybrid), wind power generation or solar power generation; power conversion equipment such as power source equipment or uninterruptible power supply equipment; so-called an inverter for controlling a motor in an elevator, a rolling machine and machine tools; or controlling equipment using semiconductor elements such as power transistors or thyristors in a railway vehicle or an electric vehicle.

Priority is claimed on Japanese Patent Application No. 2014-262356, filed Dec. 25, 2014, the content of which is incorporated herein by reference.

Background Art

As a cooling device used for cooling controlling equipment utilizing semiconductor element such as power transistors or thyristors, a cooling device (an ebullient cooling device) cooling a heat-generating body by latent heat when coolant boils is known.

For example, a cooling device (a heat pipe cooling device) described in Patent Document 1 has a structure in which tubular tanks having large sectional areas are buried in a base block which receives heat of a heat-generating body such as a semiconductor element, thin pipes stand on side sides of exposed parts of the tanks, and fins are fixed on the pipes: the heat of the heat-generating body can be cooled by outside air.

A cooling device (an ebullient cooling device) described in Patent Document 2 includes a housing part housing a liquid coolant, a communication chamber having an interior space communicating with the housing part, and a condensation part protruding a side of the communication chamber: the communication chamber has a guide plate guiding the boiling liquid coolant to an opening upper part of the condensation part; so that the coolant is prevented from flowing into the condensation part and condensation performance (cooling performance) of the condensation part can be maintained.

CITATION LIST

Patent Document 1:
  Japanese Unexamined Patent Application, First Publication No. 2004-125381

Patent Document 2:
  Japanese Unexamined Patent Application, First Publication No. 2012-234928

SUMMARY OF INVENTION

Technical Problem

In the cooling device having the structure described in Patent Document 1, it is not possible to boil the coolant efficiently if an inner diameter of the tanks (boiling tubes) is not large at a certain degree. It is not possible to perform the cooling performance sufficiently if more than half of the tank is not buried in the base block. Moreover, it is necessary to provide many threaded holes for installing the heat-generating bodies in the base block, so that the number of tanks and installing positions of the heat-generating bodies are restricted in order to avoid obstructing the threaded holes and the tanks each other.

In order to show the ebullient cooling performance, it is necessary to secure an appropriate space in the tank in which the coolant is maintained and to connect the pipes to this space. It is ideal that this space is more than 1 of 3 of volume of the tank. If there is no liquid coolant in a tube bottom of the tank, it is not possible to show the ebullient cooling performance.

However, in a cooling device for vehicle used for an electric vehicle, when the vehicle runs a slope, the coolant may remain liquid and reach the pipe if the space of the tank is filled with the liquid coolant partially in a tube axis direction of the tank, or an occasion may be incurred in which there is no liquid coolant at the bottom of the tank.

In the cooling device having a structure described in Patent Document 2, because the condensation part (a cooling tube) is arranged upper than a liquid level of the coolant and the liquid level must be upper than the heat-generating body, it is necessary to maintain a large space in order to provide the housing part (a boiling tube) and the condensation part.

The present invention is achieved in consideration of the above circumstances, and has an object to provide a cooling device which can improve cooling performance though it is configured to be compact.

Solution to Problem

A cooling device according to the present invention includes a base block having a mounting side on which at least one heat-generating body is installed along a vertical direction; at least one pipe unit including a tank buried at an opposite side to the mounting side of the base block and storing coolant, and pipes which are connected to the tank in a state of standing at a side of the tank and being parallel to each other, and heat radiation fins installed on the pipes in a state in which the pipes penetrate the heat radiation fins. In this cooling device, the tank is formed to have a flattened shape with a smaller thickness along a thickness direction of the base block than a height along the vertical direction; and the pipes are connected to an upper position of the tank.

By providing the tank configuring the pipe unit to have the flattened or oval shape so as to be a thinner shape comparing to a circular tube shape, a bury depth at the base block in the thickness direction can be small while maintaining a contact area to the base block of the tank as in a case where the tank has a circular tubular shape. Accordingly, even in a case in which the base block is formed to have a same thickness as a conventional thickness, a cooling performance can be sufficiently maintained: moreover, the thickness can be kept for installing screws for installation of the heat-generating body. Therefore, even in a case in which the heat-generating body is mounted at a position overlapping the installation position of the tank, the screws and the tank do not interfere with each other, so that the installation position of the heat-generating body and the installation position of the tank can be freely set, and the cooling device can be configured to be compact.

Since the pipes are connected to the upper position of the tank formed to be the flattened or oval shape, even when the vehicle runs the slope and the cooling device inclines, a space can be maintained in the tank and the coolant can be kept in the tank. Accordingly, the bottom of the tank is not dry out, the ebullient cooling performance can always be shown smoothly, and the cooling performance can be improved.

In the cooling device according to the present invention, it is desirable that a plurality of the at least one pipe unit is buried at the base block in parallel to each other; an installation interval of the pipe units between the tanks is set to be smaller than a planned installation interval of the heat-generating bodies; and the heat radiation fins are integrally provided to extend over the pipes of the pipe units.

In the cooling device of the present invention, it is possible to design the height along the vertical direction of the tank installed on the base block in accordance with a size of the heat-generating body: by designing the height along the vertical direction of the tank smaller than the height along the vertical direction of the heat-generating body, the tanks can be arranged in parallel with respect to the heat-generating bodies. The heat radiation fins are integrally provided to extend over the pipes at the opposite side of the base block, i.e., at a cooling side, so that it is possible to improve the cooling performance by the pipe units, and also downsize by closely arranging the pipe units to each other.

Advantageous Effects of Invention

According to the present invention, it is possible to improve the cooling performance even though the cooling device is configured to be compact.

DESCRIPTION OF EMBODIMENTS

Below, an embodiment of a cooling device of the present invention will be explained referring drawings.

Figure 1:
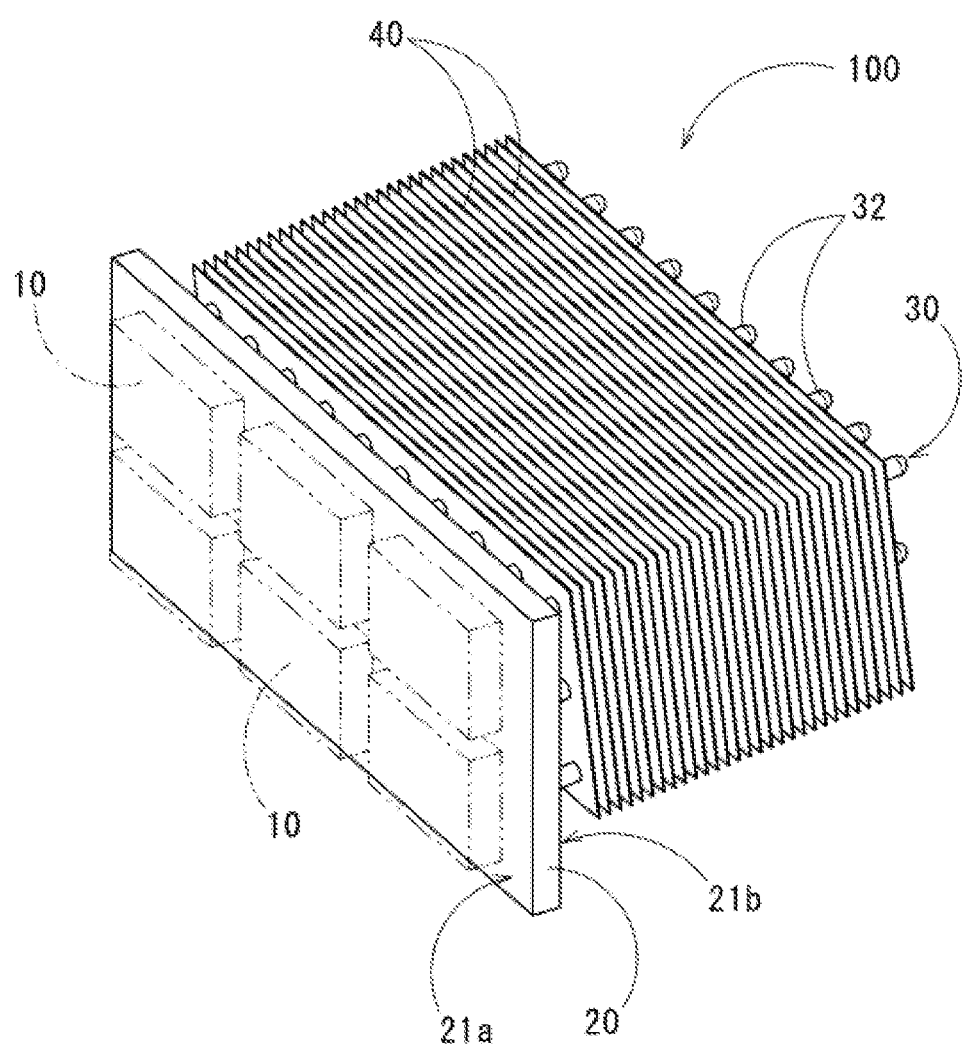
FIG. 1 is a perspective view showing a cooling device that is an embodiment of the present invention.
Figure 2:
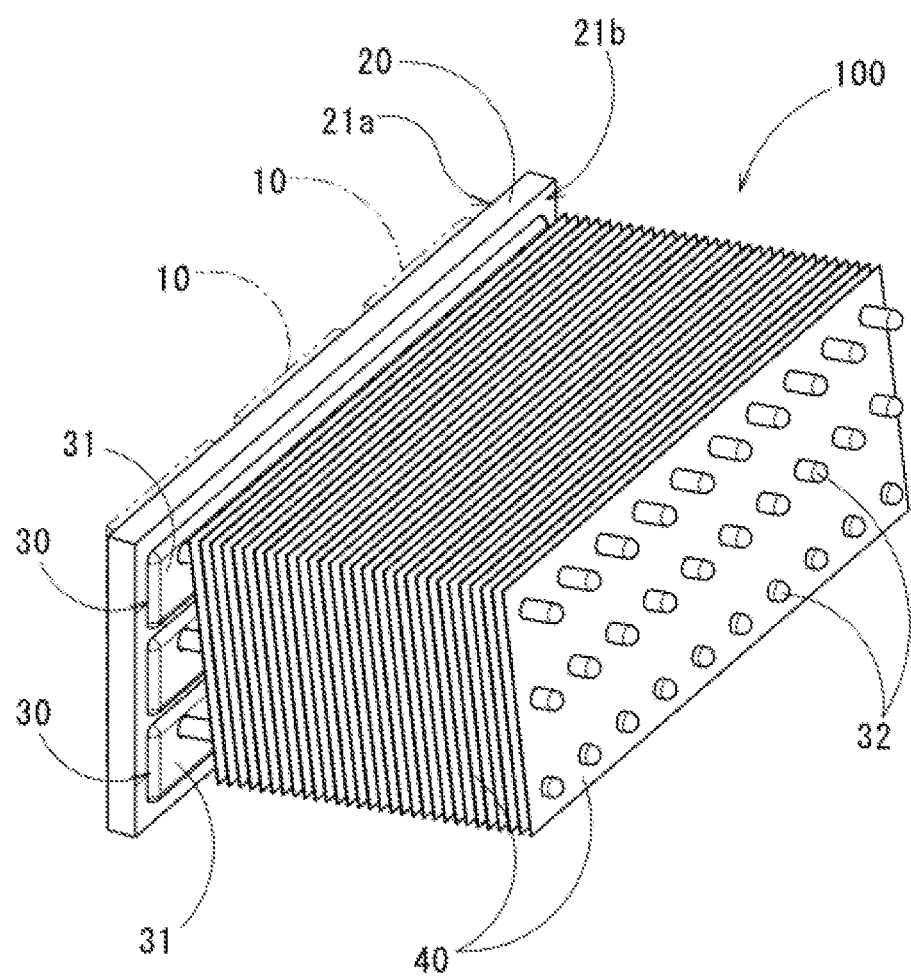
FIG. 2 is a perspective view of the cooling device shown in FIG. 1 from another angle.
Figure 3:
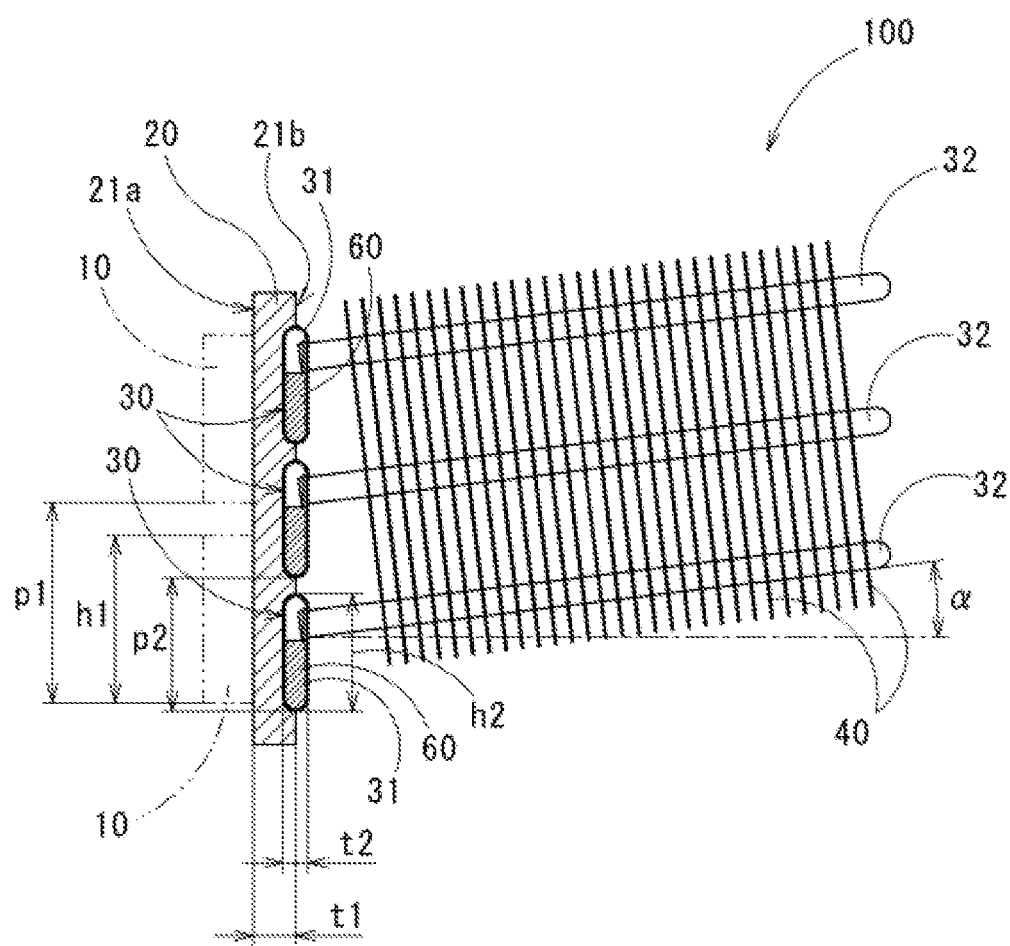
FIG. 3 is a sectional view of the cooling device shown in FIG. 1.

FIG. 1 to FIG. 3 show a cooling device 100 of an embodiment of the present invention. The cooling device 100 has a base block 20 in which a mounting side 21a on which heat-generating bodies 10 are mounted is formed along a vertical direction, pipe units 30 including a tank 31 buried at an opposite side 21b to the mounting side 21a of the base block 20 and a plurality of pipes 32 connected to the tank 31 in a state of standing at a side of the tank 31 respectively, and heat radiation fins 40 installed on the pipes 32 in a state in which the pipes 32 penetrate the heat radiation fins 40. This cooling device 100 is used for a vehicle.

The cooling device 100 is installed at lower part of a side of a vehicle so that the mounting side 21a of the base block 20 is along the vertical direction, though omitting to illustrate.

The base block 20 is made of metal having excellent thermal conductivity and large heat capacity such as aluminum, copper or the like. On the mounting side 21a at one side (a left side in FIG. 3) of the base block 20, the heat-generating bodies 10 such as semiconductor elements and the like are mounted: on the opposite side 21b at the other side (a right side in FIG. 3) than the mounting side 21a on which the heat-generating bodies 10 are mounted, the tanks 31 are buried.

The tanks 31 are made from, as shown in FIG. 3, pipes having cross sections (in FIG. 3, sections along the vertical direction) of oval or flat-oval shapes. A thickness t2 in a same direction as a thickness direction of a thickness t1 of the base block 20 is smaller than a height h2 in the vertical direction, so that the tank 31 has a flattened shape. A height h2 along the vertical direction of the tanks 31 is set to be smaller than a height h1 along the vertical direction of the heat-generating bodies 10. The tanks 31 having the oblong or flat-oval shape in the cross section can be easily made by squashing and deforming a round pipe in a radial direction, for example. By connecting the thin pipes 32 to the flattened tanks 31 at flat sides, the pipe units 30 are configured. These tanks 31 and the pipes 32 are made of aluminum or copper.

The pipes 32 are provided by standing at the upper position of the sides of the tanks 31 in parallel to each other with regular spaces, forming lines along extending directions of the tanks 31, as shown in FIG. 1 and FIG. 2. Each of the pipes 32 is arranged to be inclined from a connecting end with the tank 31 toward a closing end at the other side, upward at an angle α with respect to a horizontal direction. The pipes 32 and the respective tanks 31 are bonded to have one inner space by brazing, so that the inner space stores coolant 60 such as pure water, perfluorocarbon or the like.

The angle α is set based upon an angle which has a probability that the cooling device 100 may be inclined when the vehicle runs a slope. Installing the pipes 32 to be inclined in this manner, it is possible to prevent the liquid coolant 60 from flowing into the pipes 32 when the cooling device 100 is inclined.

Arranging the tanks 31 on which the pipes 32 are attached (the pipe units 30) in parallel in the vertical direction on the opposite side 21b of the base block 20 as shown in FIG. 1 to FIG. 3, so the pipes 32 are arranged in a matrix. In this embodiment, as shown in FIG. 2, the pipes 32 are arranged in a latticed manner viewing from the top, but the other arrangement, e.g., in zig-zags, can be applied.

The pipe units 30 (the tanks 31) are buried in parallel at the base block 20, with installation intervals (a pitch p2) along the vertical direction set to be smaller than a planned installation interval (a pitch p1) of the heat-generating bodies 10. In the cooling device 100 of the present invention shown in FIG. 1 to FIG. 3, three stages of the pipe units 30 are installed with respect to two upper/lower stages of the heat-generating bodies 10.

The tank 31 of the respective pipe units 30 is buried at the base block 20 with a depth more than half of the thickness t2 of the tank 31, and integrally bonded with the base block 20 by soldering or the like. Accordingly, heat transmission is smoothly performed between the base block 20 and the tanks 31.

To the pipes 32, the heat radiation fins 40, each having a thin plate shape made of aluminum or copper having excellent thermal conductivity, are fixed in a state of being penetrated by the pipes 32 and layered in a skewering state. On the heat radiation fins 40, through holes (not illustrated) made by burring or the like are formed at prescribed positions of the thin plates. By fit-inserting the pipes 32 into these through holes, the heat radiation fins 40 are fixed extending between the pipes 32 and integrated with the pipes 32. The heat radiation fins 40 can be also fixed by expanding the pipes 32 which are inserted in the through holes of the heat radiation fins 40.

In the cooling device 100 configured as above, the heat generated at the heat-generating bodies 10 is transferred to the base block 20, and further transferred to the tanks 31 of the pipe units 30 from the base block 20, so that the coolant 60 is boiled and evaporated in the tanks 31. Then, the evaporated coolant 60 steam rises in the tanks 31 and moves into the pipes 32, so as to be cooled by transferring the heat to the heat radiation fins 40 via the pipes 32.

In the cooling device 100 of the present embodiment, the tanks 31 configuring to the pipe units 30 are formed to be oblong or flat shapes which are thinner than a round pipe shape. As a result, contacting area of the tanks 31 to the base block 20 is kept as in a case in which the tank is round-pipe shaped, and burying amount into the base block in the thickness direction can be small. Accordingly, even in a case in which the base block 20 is formed with the same thickness t1 as conventional, the cooling performance can be sufficiently maintained, and thickness for providing the threaded holes (not illustrated) for installing the heat-generating bodies 10 can be retained. Therefore, even in a case in which the heat-generating bodies 10 are disposed at positions overlapping the installation positions of the tanks 31, the screws and the tanks 31 do not interfere with each other, so that the installation positions of the heat-generating bodies 10 and the installation positions of the tanks 31 can be freely set, and the cooling device can be configured to be compact.

Since the pipes 32 are connected to the upper position of the tank 31 formed to be the flattened shape, the space between the liquid level of the coolant 60 and connection ports to the pipes 32 can be vertically kept large in the tanks 31. Accordingly, the spaces of the tanks 31 can be kept large when the vehicle runs a slope and the cooling device 100 is inclined, and it is possible to prevent the liquid coolant 60 from flowing into the pipes 32 from the tanks 31. Furthermore, since the tanks 31 have the flattened shape and the height h2 in the vertical direction is large, the liquid coolant 60 can be maintained in the tanks 31 even when the cooling device 100 is inclined. As a result, the bottoms of the tanks 31 are not dry out, the ebullient cooling performance can always be shown smoothly, and the cooling performance can be improved.

Moreover, in the cooling device 100 of the present embodiment, since the height h2 along the vertical direction of the tanks 31 are smaller than the height h1 along the vertical direction of the heat-generating bodies 10, and the installation interval p2 of the tanks 31 are smaller than the planned installation interval p1 of the heat-generating bodies 10, so that it is to possible to dispose the tanks 31 in parallel in the vertical direction with respect to the one heat-generating body 10. At the opposite side 21b of the base block 20, i.e., at the cooling side, the heat radiation fins 40 are integrally provided to extend over the pipes 32. Accordingly, it is possible to improve the cooling performance by the plurality of the pipe units 30, and also downsize by closely arranging the pipe units 30 to each other.

Note that, in a case in which the installation interval p2 of the tanks 31 is set to be larger than the planned installation interval p1 of the heat-generating bodies 10, when the liquid amount of the coolant 60 is reduced (or partial) in the tanks 31 by inclining the vehicle or the like, the tanks 31 might be boiled with no water.

The present invention is not limited to the above-described embodiment and various modifications may be made without departing from the scope of the present invention.

For example, as the heat radiation fins 40, other than the installation structure in which all the pipes 32 penetrate them as in the above embodiment, it is possible to apply a structure in which dividing the pipes 32 into some groups and small heat radiation fins are respectively fixed to the groups of the pipes 32.

INDUSTRIAL APPLICABILITY

Improving cooling performance even though the cooling device is configured to be compact.

REFERENCE SIGNS LIST 10 heat-generating body
20 base block
21a installation side
21b opposite side
30 pipe unit
31 tank
32 pipe
40 heat radiation fin
60 coolant
100 cooling device

The invention claimed is:

1. A cooling device comprising:
a base block having a first length along a vertical direction and a first thickness, the base block further having a mounting side on which at least one heat-generating body is installed;
at least one pipe unit comprising a tank buried at an opposite side to the mounting side of the base block and storing coolant, and a plurality of pipes which are connected to a side of the tank, wherein each of the plurality of pipes has a longitudinal axis, and each of the respective longitudinal axes are parallel to one another; and
heat radiation fins installed on the pipes in a state in which the pipes penetrate the heat radiation fins, wherein the tank has a flattened shape with a pair of first inner walls having a first tank thickness dimension along a first thickness direction of the base block and a pair of second inner wall surfaces having a second tank height dimension along the first length of the block, wherein the second tank height dimension is larger than the first tank thickness dimension, wherein each of the pipes form an opening at an upper portion of the second inner wall surface of the tank with respect to the second tank height dimension, wherein each of the openings formed at the upper portion of the second inner wall surface is formed at a location above the center point of the second tank height dimension.

2. The cooling device according to claim 1, further comprising:
a plurality of the at least one pipe units buried at the base block in parallel arrangement;
an installation interval of the pipe units between the tanks is smaller than an installation interval of the at least one heat-generating body, wherein at least one of the heat radiation fins is installed on the pipes so that all of the pipes of the plurality of the at least one pipe units penetrates the at least one of the heat radiation fins.

3. The cooling device of claim 1, wherein at least a portion of the base block forms a first plane, wherein the pipes form an oblique angle with respect to the first plane.

4. The cooling device of claim 1, wherein each of the openings formed at the upper portion of the second inner wall surface are formed at a location other than the center point of the second tank height dimension.

5. The cooling device of claim 1, wherein the tank is buried within the base block with a depth of more than half of the first tank thickness.

6. The cooling device of claim 1, wherein the second pair of second inner wall surfaces are flat.

7. A cooling device comprising:
   a base block having a first length along a vertical direction and a first thickness, the base block further having a mounting side on which at least one heat-generating body is installed;
   at least one pipe unit comprising a tank buried at an opposite side to the mounting side of the base block and storing coolant, and a plurality of pipes which are connected to a side of the tank, wherein each of the plurality of pipes has a longitudinal axis, and each of the respective longitudinal axes are parallel to one another; and
   heat radiation fins installed on the pipes in a state in which the pipes penetrate the heat radiation fins, wherein the tank has a flattened shape with a pair of first inner walls as curved surfaces having a first tank thickness dimension along a first thickness direction of the base block and a pair of second inner wall surfaces having a second tank height dimension along the first length of the block, wherein the second tank height dimension is larger than the first tank thickness dimension, wherein each of the pipes form an opening at an upper portion of the second inner wall surface of the tank with respect to the second tank height dimension, wherein each of the openings formed at the upper portion of the second inner wall surface is formed at a location above the center point of the second tank height dimension.

* * * * *